United States Patent [19]

Desso et al.

[11] 4,203,646
[45] May 20, 1980

[54] CLIP FOR ELECTRICALLY CONNECTING PLANAR ELEMENTS, SUCH AS SOLAR CELLS, AND THE LIKE, IN SERIES

[75] Inventors: Jerome A. Desso, Steelton; Leon T. Ritchie, Mechanicsburg; Marvin L. Yeager, Carlisle, all of Pa.

[73] Assignee: AMP Incorporated, Harrisburg, Pa.

[21] Appl. No.: 12,264

[22] Filed: Feb. 15, 1979

Related U.S. Application Data

[63] Continuation-in-part of Ser. No. 906,543, May 17, 1978, abandoned.

[51] Int. Cl.² ............................................. H01R 13/12
[52] U.S. Cl. ...................... 339/205; 339/258 P; 136/89 P; 357/79
[58] Field of Search ................. 339/205, 258 R, 258P; 136/89 P, 89 PC; 357/79

[56] References Cited

U.S. PATENT DOCUMENTS

| | | | |
|---|---|---|---|
| 3,990,097 | 11/1976 | Lindmayer | 357/30 |
| 4,028,151 | 6/1977 | Lindmayer | 148/189 |
| 4,028,794 | 6/1977 | Ritchie et al. | 29/629 |
| 4,037,915 | 7/1977 | Cabaud | 339/258 P |
| 4,056,405 | 11/1977 | Varadi | 136/89 PC |
| 4,057,439 | 11/1977 | Lindmayer | 136/89 P |
| 4,058,418 | 11/1977 | Lindmayer | 148/175 |

FOREIGN PATENT DOCUMENTS 2,715,177  10/1977  Fed. Rep. of Germany ...... 339/258 R

*Primary Examiner*—Joseph H. McGlynn
*Attorney, Agent, or Firm*—Russell J. Egan

[57] ABSTRACT

A clip is disclosed for interconnecting planar elements, such as solar cells, and the like, in series. The cells are connected by the clip to electrically interconnect a top circuit of one element to a bottom circuit of an adjacent element. The clips are manufactured from stock which includes a metallic strip with at least one insulating web secured along one surface covering approximately half the area thereof. At least two cantilever beams are stamped from the strip extending toward each end of the clip and lying spaced above a portion of the clip. The first arm presents an insulated surface to an uninsulated portion of the clip while the second arm presents an uninsulated surface to an insulation portion of the clip.

6 Claims, 6 Drawing Figures

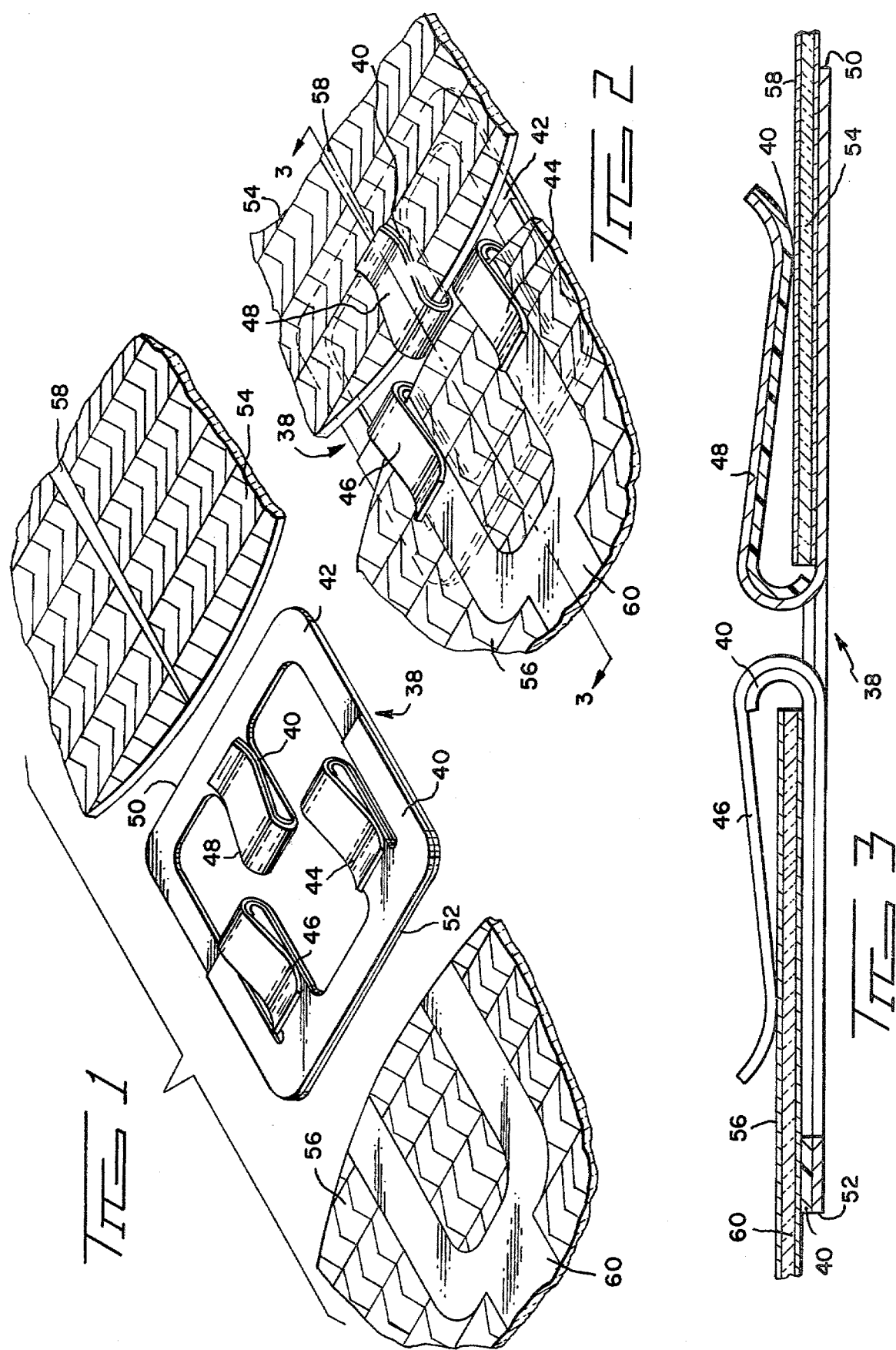

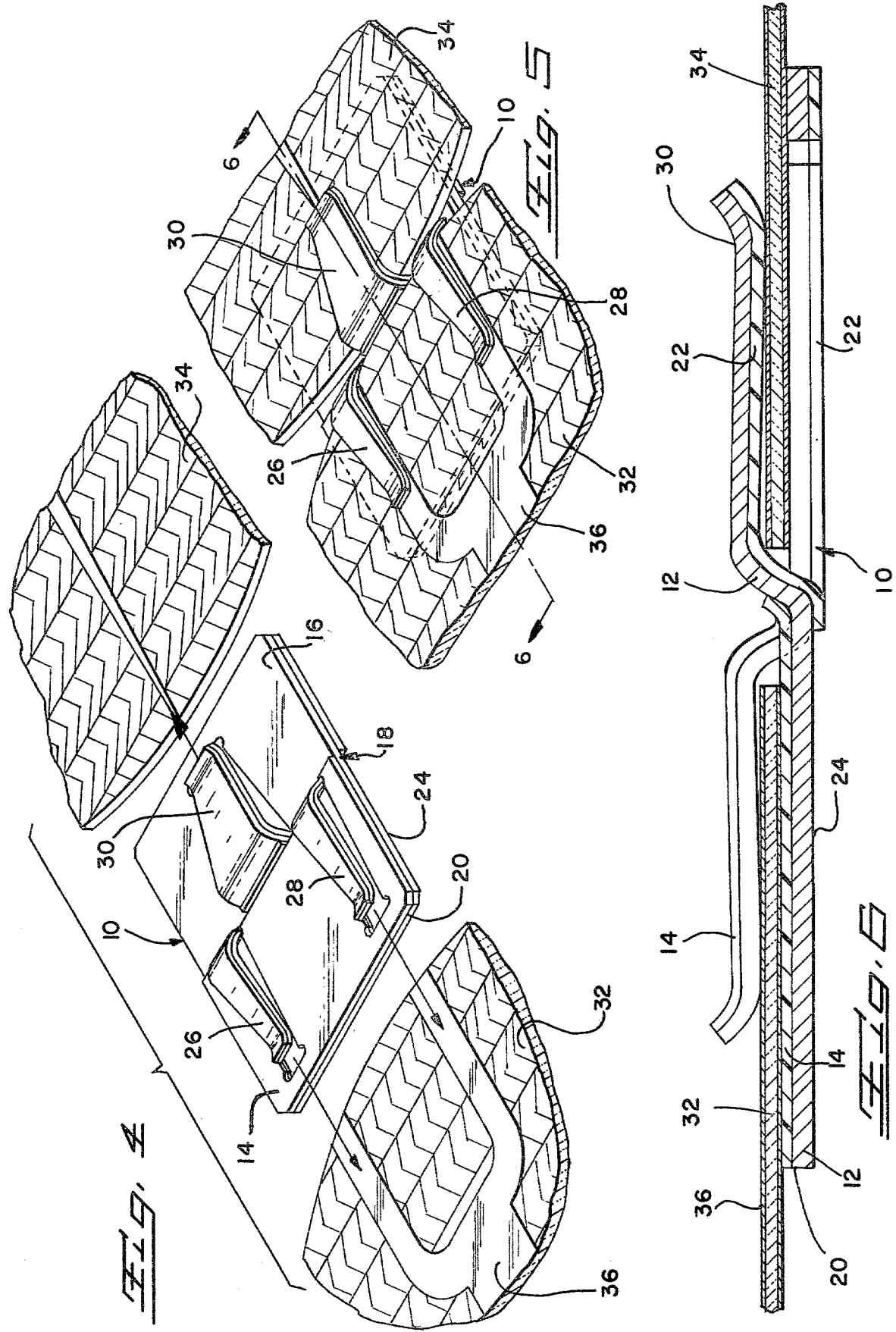

CLIP FOR ELECTRICALLY CONNECTING PLANAR ELEMENTS, SUCH AS SOLAR CELLS, AND THE LIKE, IN SERIES

CROSS REFERENCE TO RELATED APPLICATION

The present application is a continuation-in-part of our application Ser. No. 906,543 filed May 17, 1978, now abandoned.

BACKGROUND OF THE INVENTION

1. The Field Of The Invention

The present invention relates to an inexpensive clip for electrically connecting planar elements, such as solar cells, and the like, in series.

2. The Prior Art

Solar cells capable of directly converting solar energy to electrical energy are well known. For example, a typical solar cell is disclosed in U.S. Pat. No. 3,990,097. Such cells are generally in the range of approximately 5 centimeters square or 2⅜ to 3 inches in diameter and are normally about 0.015 inches thick. They can be made by the methods disclosed in U.S. Pat. Nos. 4,028,151 and 4,058,418. It is generally desirable to connect the solar cells in series, in panels, or arrays for increased voltage output. Representative solar cell panels are disclosed in U.S. Pat. Nos. 4,056,405 and 4,057,439. However, in making the interconnection of the cells there are several things which must be considered. One consideration is the connection must not diminish the effective surface area of the cell by blocking it with a large contact area, thereby reducing the voltage that could be achieved from a single cell. Another consideration is to provide adequate force for good electrical continuity during all operating environments and to retain the solar cell in place without applying such extreme force that the cell would be damaged and/or destroyed.

SUMMARY OF THE INVENTION

The present invention concerns a laminated clip for electrically connecting planar elements, such as solar cells, and the like, in series with the subject clip providing electrical interconnection between a first side of a first element and a second side of a second element. Other clips would continue the series with a second clip connecting the first side of the second element to the second side of a third element, etc. The clip is blanked and formed from a metal strip, that can be preplated and laminated with at least one web of insulative material on one side covering approximately half the surface area of the clip. The clip includes at least two oppositely directed beams stamped to lie spaced above a portion of the clip extending towards the opposite ends thereof. Insulated surfaces of the clip or beams are opposed by uninsulated surfaces of the respective beam or clip.

It is therefore an object of the present invention to produce an improved clip for electrically interconnecting adjacent planar elements, such as solar cells and the like so as to provide good electrical continuity throughout a wide range of operating environments.

It is another object of the present invention to produce an improved clip for electrically interconnecting solar cells, and the like, with sufficient force to retain the cell in proper alignment in an array without applying such force as would damage or destroy the cell.

It is a further object of the present invention to produce a laminated clip for electrically interconnecting adjacent planar elements, such as solar cells, in electrical series and which clip can be readily and economically produced.

The foregoing objects and other advantages of the present invention will become apparent to those skilled in the art from the following detailed description taken with reference to the accompanying drawings.

BRIEF DESCRIPTION OF THE DRAWINGS

FIG. 1 is a perspective view of a first embodiment of the subject connector clip with fragments of two solar cells exploded therefrom;

FIG. 2 is a perspective view, similar to FIG. 1, with the solar cells engaged in the respective portions of the first embodiment of the subject clip;

FIG. 3 is an enlarged, vertical longitudinal section through the first embodiment of the subject clip taken along line 3—3 of FIG. 2;

FIG. 4 is a perspective view of an alternate embodiment of the subject clip with fragments of two solar cells exploded therefrom;

FIG. 5 is a perspective view, similar to FIG. 4, with the solar cells engaged in the respective portions of the alternate embodiment of the subject clip; and FIG. 6 is an enlarged, vertical longitudinal section through the alternate embodiment of the subject clip taken along line 6—6 of FIG. 5.

DETAILED DESCRIPTION OF THE PREFERRED EMBODIMENT

The subject connector clip 10 is formed from conventional metal stock 12, which can be preplated with any of the standard plating materials if desired, and is shown with an overall rectangular configuration. The clip has a first web of insulative material 14 secured to the obverse 16 between a medial portion 18 and one end 20 of the clip 10 and a second layer of insulative material 22 secured to the reverse 24 between the medial portion 18 and the opposite end 25 of the clip 10. A plurality of spring arms or cantilever beams 26, 28, 30 are formed on the clip 10 with first arms 26, 28 extending towards end 20 from the median 18 and arm or beam 30 extending in the opposite direction towards end 25. Each arm or beam is formed from the reverse to project spaced from the obverse 16 of the clip. Thus the bottom surfaces of first arms 26, 28 are conductive and oppose the insulative material 14 while the bottom surface of second arm 30 is insulated by web 22 and opposes the bare or conductive obverse 16 of clip 10. The relative positioning of the insulative webs and the arms can best be appreciated from FIG. 3.

The subject clip 10 receives solar cells 32, 34 in the opposite ends 20, 25, respectively with the first arms 26, 28 electrically and mechanically engaging the upper surface of solar cell 32 and holding the bottom surface of the cell 32 against the insulative layer 14. The second solar cell 34 is received between the insulative material 22 on the bottom surface of second arm 30 and the uninsulated obverse 16 of the second end 25 of the clip. Thus the subject clip engages the edge of the cells to make contact with the circuit or path 36 of the cell that gets exposed to the sun, with the circuit being completed by connecting the top side or sun facing side of one cell with the bottom or shaded side of the adjacent cell. The insulation on the clips prevents short circuiting between adjacent like sides of the cells.

An alternate embodiment of the subject clip is shown in FIGS. 4 to 6. This clip 38 is likewise formed from conventional metal stock, which can be preplated with any of the standard plating materials if desired, and also has an overall rectangular configuration. The clip 38 has a single web of insulative material 40 bonded to the obverse 42 covering approximately half the surface area thereof. A plurality of interdigitated spring arms or cantilever beams 44, 46, 48 are formed in a central portion of the clip. Each arm is folded upon itself so that first arms 44, 46 have their free ends directed towards end 52 of the clip and second arm 48 has its free end directed toward end 52 of the clip. Thus first arms 44, 46 have an insulated lower inner surface facing an upper inner uninsulated surface while second arm 48 has upper inner insulated surface facing lower inner uninsulated surface. This arrangement can best be appreciated from FIG. 3.

This embodiment of the subject clip receives adjacent portions of two planar elements, such as solar cells 54, 56, in the same manner as previously described. The upper portion of second arm 48 will have an insulated surface engaging circuit 58 on the obverse surface of the first cell 54 with the lower uninsulated portion of the arm making mechanical and electrical contact with the reverse surface of the cell. The second cell 56 is received in the first arms 44, 46 with the uninsulated upper or folded arm portions engaging circuitry 60 on the obverse while the reverse of the cell rests against insulation 40.

The present invention may be subject to many modifications and changes without departing from the spirit or essential characteristics thereof. The present embodiment should therefore be considered in all respects as illustrative and not restrictive of the scope of the art.

What is claimed is:

1. A clip for electrically interconnecting adjacent pairs of planar members, such as solar cells and the like, in series, said clip comprising:
   a metal blank having at least one web of insulative material bonded to one side of said blank covering approximately half the surface area thereof,
   at least one first arm and at least one second arm formed in said blank, each arm extending in cantilever fashion above a portion of said blank toward an end thereof,
   said first and said second arms being oppositely directed with said first arm presenting an uninsulated surface to an insulated portion of said blank and said second arm presenting an insulated surface to an uninsulated portion of said blank whereby first and second members received in opposite ends of said clip have a first side of a first member electrically connected to a second side of a second member.

2. A clip according to claim 1 wherein:
   said first and second arms are formed extending inwardly from opposite ends of the clip to include a portion of said web of insulative material, each said arm being folded upon itself thereby forming outwardly directed member receiving clips, said first arm presenting an uninsulated surface to the obverse of a first member received therein and an insulated surface to the reverse of said first member, said second arm presenting an insulated surface to the obverse of a second member received therein and an uninsulated surface to the reverse of said second member.

3. A clip according to claim 1 further comprising:
   a second web of insulative material bonded to the opposite side of said blank from said at least one web, said webs extending in opposite directions from a medial portion of said blank,
   said first and second arms being stamped from the reverse of said blank to extend in opposite directions from a medial portion of said clip, said first arm presenting an uninsulated surface to an insulated portion of the clip and said second arm presenting an insulated surface to an uninsulated portion of the clip.

4. A clip for electrically interconnecting in series adjacent pairs of planar elements, such as solar cells capable of converting solar energy to electrical energy, said clip comprising:
   a metal blank having a first web of insulative material bonded to one end of the obverse and a second web of insulative material bonded to the reverse at an opposite end thereof;
   at least one first arm formed extending in cantilever fashion from a medial portion of said blank towards said one end, said at least one arm having an exposed conductive bottom surface facing said first insulative web, and
   at least one second arm formed extending in cantilever fashion from a medial portion of said blank towards said opposite end, said at least one second arm presenting an insulated surface towards the conductive obverse surface of said clip whereby first and second elements are received in opposite sides of said clip with a first side of a first element connected to a second side of a second element.

5. A laminated connector for interconnecting in series adjacent pairs of planar elements, such as solar cells, within an array of like elements, said clip comprising:
   a unitary metallic member having a first web of insulation material bonded to one end portion of the obverse side and a second web of insulation material bonded to an opposite end portion of the reverse side parallel to but displaced from said first web,
   first and second oppositely directed clip portions each defined by at least one cantilever beam integral with a medial portion of said member and projecting in opposite directions along said obverse side, the first of said clips having said web of insulation material lying on the obverse side with the surface of said beam opposing the insulated obverse of the member being uninsulated and the second of said clips having said second web of insulation bonded to said reverse with the surface of said beam opposing the uninsulated obverse surface of said member being insulated,
   whereby adjacent solar cells are electrically connected in series by a first side of a first cell being engaged by said first clip and a second side of a second cell being engaged by the obverse of said member, the second side of the first cell and first side of said second cell lying against portions of said first and second webs of insulative material, respectively.

6. A connector for interconnecting in series adjacent pairs of planar elements, such as solar cells, within an array of like elements, said clip comprising:
   a unitary metallic member having at least one web of insulation material bonded to one end portion of the obverse side covering approximately half the area thereof, first and second oppositely directed clip portions each defined by at least one folded cantilever beam integral with and extending inwardly from an end portion of said member and opening in opposite directions towards their respective ends, the first of said clips having said web of insulation material underlying the uninsulated end portion of said beam and the second of said clips having an insulated end portion overlying an uninsulated portion, whereby adjacent elements are electrically connected in series by a first side of a first element being electrically contacted by the upper portion of said first clip and a second side of a second element being electrically contacted by the lower portion of said second clip, the second side of the first element and first side of said second element lying against portions of said first and second webs of insulative material, respectively.

* * * * *